(12) United States Patent
Confalonieri et al.

(10) Patent No.: US 7,098,831 B2
(45) Date of Patent: Aug. 29, 2006

(54) HIGH RESOLUTION AND LOW CONSUMPTION DIGITAL-ANALOG CONVERTER

(75) Inventors: Pierangelo Confalonieri, Caponago (IT); Germano Nicollini, Piacenza (IT); Riccardo Martignone, Carnate (IT)

(73) Assignee: STMicroelectronics S.r.l., (IT)

( * ) Notice: Subject to any disclaimer, the term of this patent is extended or adjusted under 35 U.S.C. 154(b) by 168 days.

(21) Appl. No.: 10/791,663

(22) Filed: Mar. 2, 2004

(65) Prior Publication Data

US 2004/0233089 A1 Nov. 25, 2004

(30) Foreign Application Priority Data

Mar. 14, 2003 (EP) .................................. 03425160

(51) Int. Cl.
H03M 1/66 (2006.01)
(52) U.S. Cl. ....................................... 341/145; 341/144
(58) Field of Classification Search ................ 341/144, 341/145, 153, 154
See application file for complete search history.

(56) References Cited

U.S. PATENT DOCUMENTS

| | | | |
|---|---|---|---|
| 4,450,433 A | | 5/1984 | Moriyama |
| 4,488,144 A | | 12/1984 | Wollman |
| 4,573,036 A | * | 2/1986 | Wondra ...................... 341/135 |
| 5,294,927 A | | 3/1994 | Levinson |
| 5,323,159 A | | 6/1994 | Imamura |
| 5,541,597 A | | 7/1996 | Chi-Mao |
| 5,592,165 A | * | 1/1997 | Jackson et al. ............. 341/143 |
| 5,703,588 A | * | 12/1997 | Rivoir et al. ............... 341/159 |
| 5,831,566 A | | 11/1998 | Ginetti |
| 6,191,720 B1 | * | 2/2001 | Zhang ........................ 341/145 |
| 6,246,351 B1 | * | 6/2001 | Yilmaz ....................... 341/145 |
| 6,486,818 B1 | * | 11/2002 | Nicholson et al. .......... 341/154 |

OTHER PUBLICATIONS

Chen, et al., "A CMOS Implementation of a Video-Rate Successive Approximation A/D Converter", IEEE, Jun. 7, 1988, pps. 2577-2580, XP010069442.
European Search Report, EP 03 42 5260, dated Aug. 14, 2003.

* cited by examiner

*Primary Examiner*—Linh V Nguyen
(74) *Attorney, Agent, or Firm*—Jenkens & Gilchrist, PC

(57) ABSTRACT

A digital-to-analog converter includes a first section (MSB) that converts the more significant bits of a digital code into a first voltage (Vin) of a multiplicity of discrete voltages that are integral multiples of a predetermined first voltage step ($\Delta V1$). A second section (LSB) of the converter converts the less significant bits of the digital code into a current. The current is transformed into a second voltage of a multiplicity of discrete voltages that are integral multiples of a second voltage step ($\Delta V2$) equal to ½L of the product of the first voltage step ($\Delta V1$) multiplied by a predetermined coefficient, where L is the number of the less significant bits of the digital code to be converted. A summer generates an output voltage (Vout) that is the sum of the second voltage and the product of the first voltage multiplied by the predetermined coefficient. With a view to obtaining a low consumption, the summer has a resistive feedback circuit including a voltage divider (R3, R4). A conversion resistor (R4) that forms part of the voltage divider transforms the current into the second voltage.

19 Claims, 4 Drawing Sheets

HIGH RESOLUTION AND LOW CONSUMPTION DIGITAL-ANALOG CONVERTER

PRIORITY CLAIM

The present application claims priority from European Patent Application No. 03425160.3 filed Mar. 14, 2003, the disclosure of which is hereby incorporated by reference.

BACKGROUND OF THE INVENTION

1. Technical Field of the Invention

The present invention relates to a digital-to-analog converter.

2. Description of Related Art

In many circuit systems in which a digital input code has to be converted into an analog output quantity it is essential that the conversion be monotonic, that is to say, such that an increase or a reduction of the digital input code corresponds to, respectively, an increase or a reduction of the analog output quantity. In applications to portable equipment such as cell-phones, moreover, the consumption of electric energy has to be reduced to the greatest possible extent. This need is felt, for example, in the design of the converter used in the feedback circuit for controlling the frequency of the quartz oscillator that determines the clock of the system. Since this circuit is always active, a low consumption of the digital-to-analog (D/A) converter is particularly desirable.

A schematic representation of a D/A converter commonly used for this purpose is shown in FIG. 1. A resistive network, in this example a resistive divider made up of a multiplicity of resistors R ($2^{12}-1=4095$ in this particular example), all of equal resistance R and arranged in series with each other, is connected on the one hand through a transistor M1, in this example a P-channel MOSFET, to the positive terminal Vdd of a supply source, and on the other through a further transistor RL to the negative terminal (ground) of the supply source. The gate terminal of the transistor M1 is connected to the output of an operational amplifier OPA1, which has an inverting input connected to a reference voltage source Vref and a non-inverting input connected to the connection node N1 between the resistive divider and the drain terminal of the transistor M1. The divider taps (which number $2^{12}=4096$ in this example) are each connected to a terminal of an electronic switch (SW0–SW4095) that has its other terminal connected, in a common node N4, to a non-inverting input terminal of a second operational amplifier OPA2 so as to apply to it a voltage Vin that corresponds to the digital code from time to time associated with the closed electronic switch.

As far as the functioning is concerned, due to the effect of the feedback connection between the node N1 and the non-inverting input of the amplifier OPA1, the current I that passes the resistive divider is regulated in such a way as to maintain the node N1 at a voltage equal to the reference voltage Vref. The voltage Vin applied as input to the amplifier OPA2 can assume 4096 discrete values in voltage steps of $\Delta V1=I*R$, where R is the resistance of each of the resistors indicated by the same symbol between Vref and a minimum voltage determined by the resistance of the resistor RL, by means of the selective closure of the switches SW0–SW4095. Each of these discrete values represents the analog value corresponding to the digital code that determines the closure of the corresponding electronic switch. The voltage Vin is amplified by the operational amplifier OPA2 with a gain determined by the resistors R1 and R2.

The voltage at the amplifier output, which is also the output of the converter, will be Vout=Vin*(1+R1/R2), where R1 and R2 are the resistances of the resistors indicated by the same symbol in FIG. 1.

The D/A converter described above is characterized by an intrinsic monotonicity, because the divider voltage that from time to time is applied to the input of the amplifier OPA2 increases/decreases as the digital code to be converted increases/decreases and is therefore suitable for being employed in the systems cited at the beginning. Furthermore, the gain of the converter can be regulated at will by means of resistors (R1 and R2) that are not in any way related with the resistors of the resistive divider, so that they can be chosen to have a relatively high value and thus reduce the electricity consumption to a minimum. In an integrated circuit, nevertheless, the formation of this converter calls for the occupation of an extensive area on account of the large number of resistors. These resistors, moreover, cannot be realized as normal polysilicon resistors when the divider is made up of a large number of resistors. Indeed, the maximum number of resistors is limited by an overall resistance of the divider that makes the current crossing the divider become so small as to make it comparable with the leakage current of the diffused regions of the transistors that perform the function of electronic switches. In this case, moreover, even the conversion time becomes unacceptably long. In order to overcome this limit the resistors are formed by means of a technique that utilizes a special low-resistivity silicon; however, the resistors produced by the use of this technique are often of far from uniform value, so that the production yield of the integrated circuit is low.

Another known converter is shown in FIG. 2. It is made up of two sections, a first section for the conversion of the digital code with the more significant bits (MSB) and a second section for the conversion of the part of the digital code with the less significant bits (LSB). The first section, indicated overall by MSB, has a structure identical to that of the converter of FIG. 1, but in this example has only $2^9-1=511$ resistors, all having the same resistance R, and $2^9=512$ electronic switches SW0–SW511 controlled by a 9-bit decoding logic (DEC-9BIT). The second section, indicated overall by LSB, is made up of as many current generators (MD0, MD1, MD2) as there are bits considered to be less significant in the code that is to be converted, in this example three bits (D0, D1, D2). The three generators MD0, MD1, MD2 consist of N-channel MOS transistors that can be selectively connected by means of three electronic selectors SD0, SD1 and SD2 controlled by a 3-bit transcoding logic (TRANSCOD-3BIT) between the terminals (Vdd and ground) of the supply source or between the inverting input of an operational amplifier OPA2 (equal to the one of the converter of FIG. 1) and ground. The three transistors MD0–MD2 are connected in current mirror fashion to a diode-connected N-channel MOS transistor M3. The transistor M3 is connected in series to a P-channel MOS transistor M2 between the terminals of the supply source (Vdd, ground). The gate terminal of the transistor M2 is connected to the gate terminal of the transistor M1, which stabilizes the voltage applied to the resistive divider, so that the current I of the divider is mirrored in the circuit branch containing M2 and M3. The sizes of the transistors M1, M2, M3, MD0–MD2 are chosen in such a way that the generators formed by the transistors MD0–MD2 are presented in binary form, that is to say, the currents that pass through them are equal to, respectively $2^0*I/4$, $2^1*I/4$ and $2^2*I/4$, and they therefore contribute to the formation of the converter output voltage Vout in the right proportion to represent the three less significant bits of the code to be converted. In the example here presented M1 and M2 are of the same size, for example, they are formed by a single (n=1), M3 and MD2 are likewise of the same size, for example, they are formed by (n=4), MD1 has half the size of MD2, for example, it is formed by two (n=2) and MD0 has half the size of MD1, for example, it is formed by (n=1).

The output voltage of the converter is $$Vout=Vin*(1+R1'/R2')+IL*R1'$$

where R1' and R2' are the resistances of the resistors indicated by the same symbol in the figure and IL is the current that the generators MD0–MD2 inject into the connection node N2 between the resistors R1' and R2', i.e., into the inverting input terminal of the operational amplifier OPA2.

If we put R1'=R2', the gain of the amplifier OPA2 will be g=1+R1'/R2'=2, so that the contribution of the MSB section to the output of the operational amplifier OPA2 will be Vin*2 and, more particularly, the contribution made by a resistor R to the output Vout will be $\Delta V1*2=I*R*2$. If we put R1'=R, the contribution of the LSB section will be at the most equal to ⅞ of the contribution made to the output by a resistor R of the divider. In fact, if only the generator MD0 is connected to the node N2 (i.e., the selector SD0 is in the position in which the drain terminal of the transistor MD0 is connected to N2 and the selectors SD1 and SD2 are in the positions in which the drain terminals of the respective transistors MD1 and MD2 are connected to the terminal Vdd), the current IL will be ¼ of the current that passes through M3. Since the current of M3 is equal to the current of M1, i.e., equal to the current I that passes through the divider, the current injected into the node N2 will be IL=¼*I and therefore the contribution to the output Vout made by the LSB section of the converter will be equal to ⅛ of the contribution made to the output by a resistor R of the divider, because the feedback resistor R1' of the amplifier OPA2 has the same resistance R. When all three generators MD0–MD2 of the LSB section furnish their current to the amplifier OPA2, the current IL will amount to ⅞ of the current I that passes through the divider and the contribution to the output voltage will therefore amount to ⅞*I*R, i.e., ⅞ of the contribution of a resistor R of the divider. The contribution of the LSB section to the output voltage Vout will therefore be a voltage that varies in steps of $\Delta V2=\frac{1}{2}^L*2*\Delta V1$, where L is the number of the less significant bits.

The converter of FIG. 2 has the advantage that, given parity of resolution, it can be integrated into a much smaller area than the converter of FIG. 1, this thanks to the fact that it has only one eighth the number of resistors of the divider of FIG. 1 and only a few extra transistors; it is, however, associated with some drawbacks that render its use rather problematic. More particularly, bearing in mind that the divider can be realized with equal resistors R having typical values comprised between 20 and 200 Ohms and that the operational amplifier OPA2 may have a gain typically comprised between 1.5 and 2.5, the resistors that determine the gain cannot be chosen with a high resistance, as is possible in the case of the converter of FIG. 1, because the feedback resistor R1' must have a value equal to that of a resistor of the divider and R2' cannot have a value much greater than R', so that the consumption of the converter is unacceptably great. The consumption can be reduced by utilizing a feedback resistor R1' of a larger value and using correspondingly smaller current generators MD0–MD2, so that the contribution of the LSB section to the voltage output of the converter remains unchanged. Nevertheless, if significant consumption reductions are to be obtained, the increase of the feedback resistance and the reduction of the generator current would have to be of such magnitude as to make it difficult, if not altogether impossible, to realize the generators in such a way as to maintain the correct ratio between the currents they produce. In any case, one would have to avoid the generator currents becoming so small as to be comparable with the leakage currents of the junctions of the MOS transistors of which the generators are made.

Another disadvantage of the converter shown in FIG. 2 consists of the fact that it does not have a great accuracy when a large excursion of the output voltage is needed. This is due to the fact that the current generators may be far removed from the operating conditions of an ideal generator. As is well known, if a transistor is to function in conditions close to those of an ideal generator, it would always have to work in the saturation zone, that is to say, its current would have to depend only on the gate voltage and not on the drain voltage. This will be the case when the source-drain voltage never drops below a predetermined minimum value, below which the transistor would be working in the linear zone. In the case of the converter of FIG. 2, the output voltage Vout may be very close to ground potential, so that when the drain terminals of the transistors MD0–MD2 are connected to the node N2, their voltages may be so low as to cause them to operate in the non-linear zone.

There is a need in the art for a D/A converter that can be integrated into a small area and has only a limited consumption.

There is also a need in the art for a D/A converter having great linearity and precision even at the maximum excursion of the output voltage.

SUMMARY OF THE INVENTION

In accordance with one embodiment of the invention, a digital-to-analog converter includes a first section that converts the more significant bits of a digital code into a first voltage of a multiplicity of discrete voltages that are integral multiples of a predetermined first voltage step. A second section of the converter converts the less significant bits of the digital code into a current. The current is transformed into a second voltage of a multiplicity of discrete voltages that are integral multiples of a second voltage step equal to ½L of the product of the first voltage step multiplied by a predetermined coefficient, where L is the number of the less significant bits of the digital code to be converted. A summer generates an output voltage that is the sum of the second voltage and the product of the first voltage multiplied by the predetermined coefficient. The summer has a resistive feedback circuit including a voltage divider. A conversion resistor that forms part of the voltage divider transforms the current into the second voltage.

In accordance with another embodiment of the invention, a circuit includes a more significant bit converter having an analog voltage output indicative of a more significant bit portion of an input digital signal and a less significant bit converter having an analog current output indicative of less significant bit portion of the input digital signal. A summation circuit includes a first input terminal coupled to the analog voltage output and a second input terminal. A feedback path is made from a first and second resistor connected to each other at a node to form a series voltage divider coupled between the second input terminal and an output of the summation circuit. The node in the feedback path is connected to the analog current output.

In accordance with yet another embodiment of the invention, a circuit includes a more significant bit converter having an analog voltage output indicative of a more significant bit portion of an input digital signal and a less significant bit converter having an analog current output indicative of less significant bit portion of the input digital signal. A summation circuit includes a first input terminal coupled to the analog voltage output and a second input terminal. A feedback path is made between the second input terminal and an output of the summation circuit. The path is connected to the analog current output. The less significant bit converter includes a first and second plurality of current generators. A selection circuit selectively connects one or more of the first plurality of current generators to the analog current output, or alternatively selectively connects one or more of the second plurality of current generators to the analog current output, based at least in part on the less significant bit portion of the input digital signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
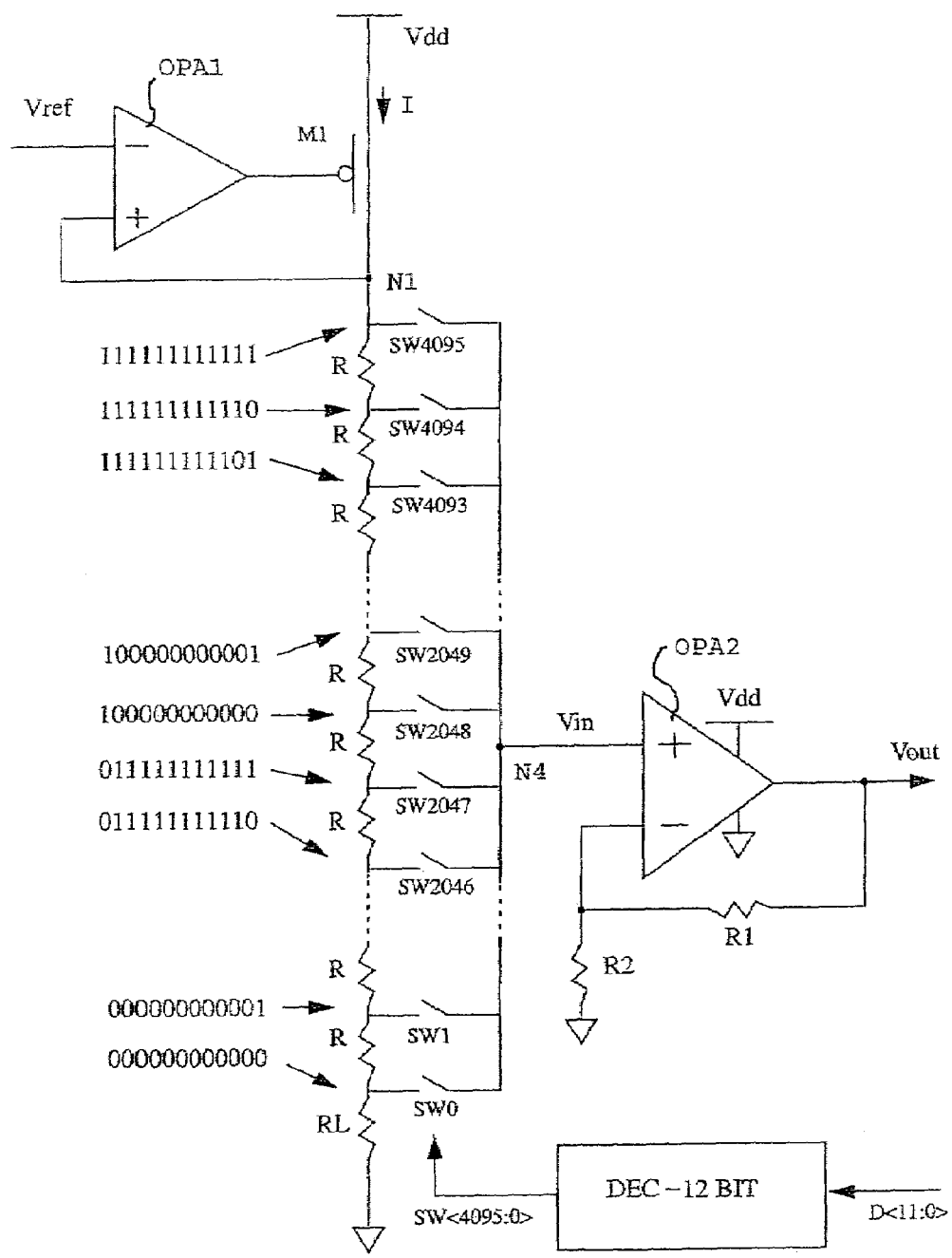
FIGS. 1 and 2 show in schematic form two D/A converters of known type.
Figure 2:
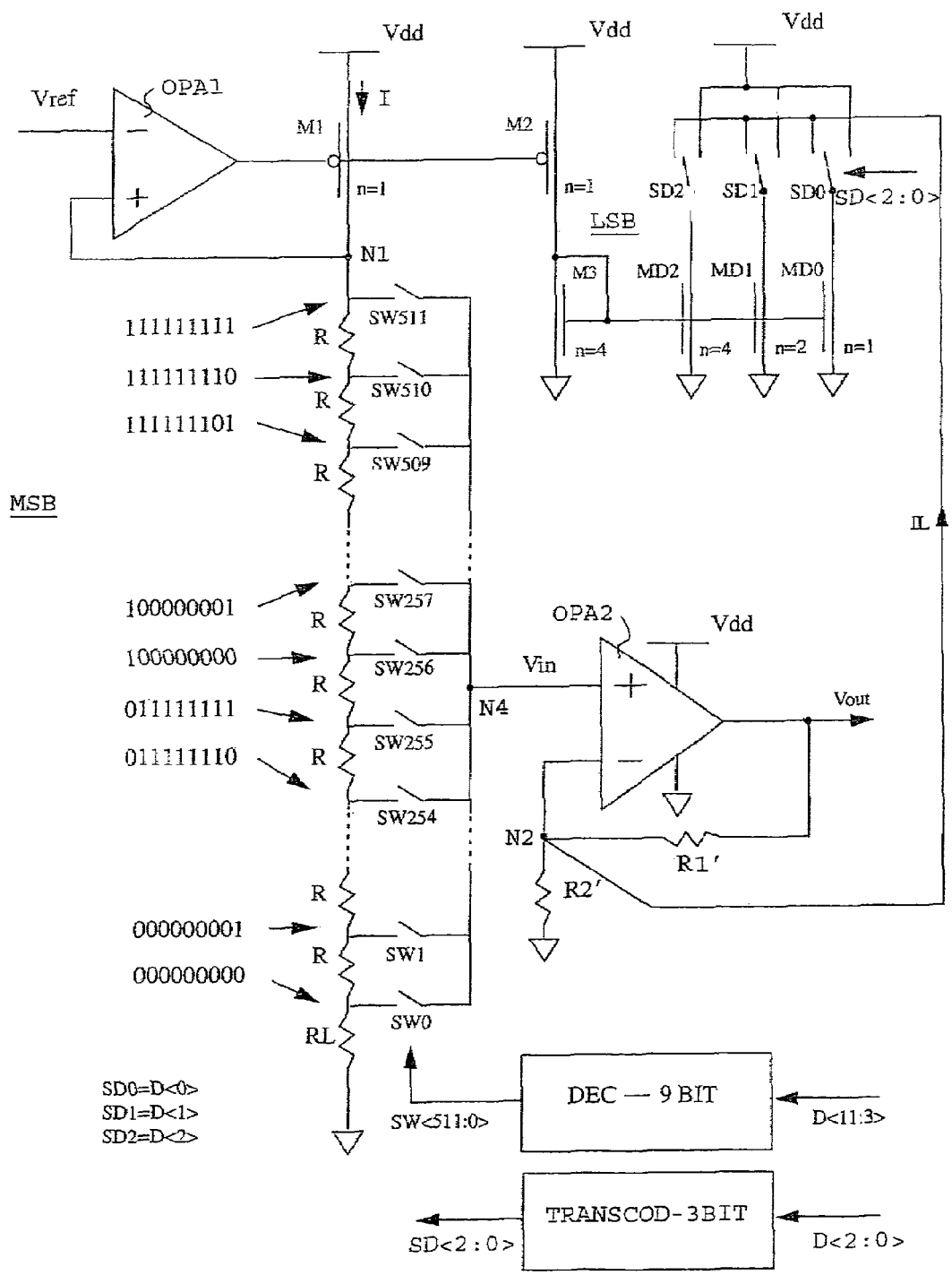
Figure 3:
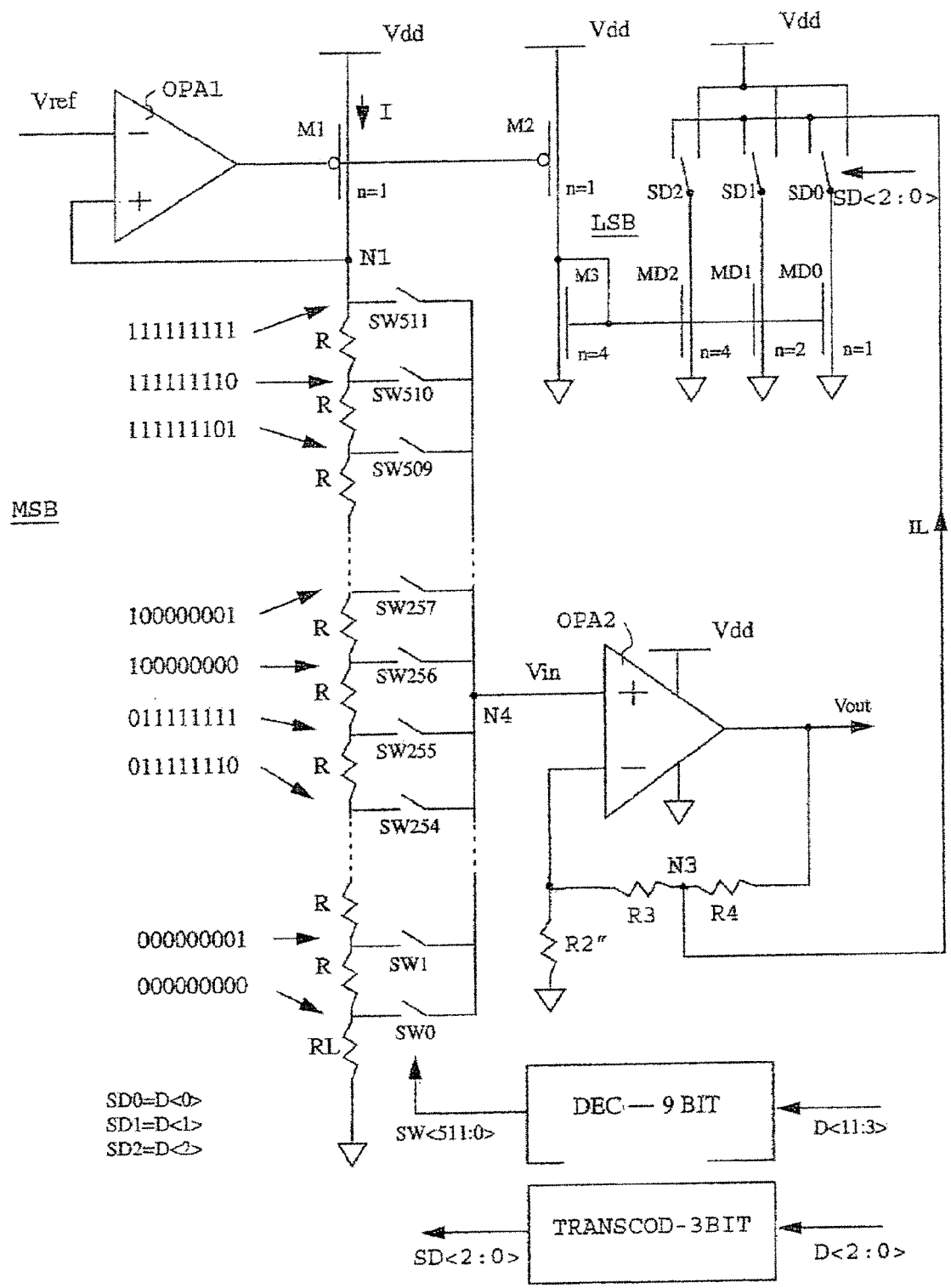
FIGS. 3 and 4 show, again in schematic form, two D/A converters in accordance with the particular embodiments of the invention.

Referring to FIG. 3, in which components equal to those of FIG. 2 are indicated by the same reference symbols, the converter in accordance with the invention differs from the one of FIG. 2 by virtue of the fact that the feedback resistance of the operational amplifier OPA2 consists of two resistors R3 and R4 arranged in series and such that R4 has the same resistance R as a resistor of the divider of the MSB section and R3 has a resistance equal to R2"−R, where R2" is the resistance of the resistor indicated by the same symbol and connected between the inverting input terminal and ground. The current of the generators of the LSB section is injected into the node N3 between the two resistors in series. The output voltage Vout of the converter, which is a function of the voltage Vin at the output of the LSB section and the current IL produced by the generators of the LSB section, will be given by:

$$Vout=Vin*(1+((R2"-R)+R)/R2")+IL*R=2*Vin+IL*R.$$

As can readily be seen, one need is addressed because the resistance R2" can be chosen as large as desired, without there being any constraint deriving from the elementary resistance R of the divider, and this makes it possible to have a converter that not only occupies a small area thanks to the reduction (⅛) of the number of resistors of the divider, but also has a small consumption.

Figure 4:
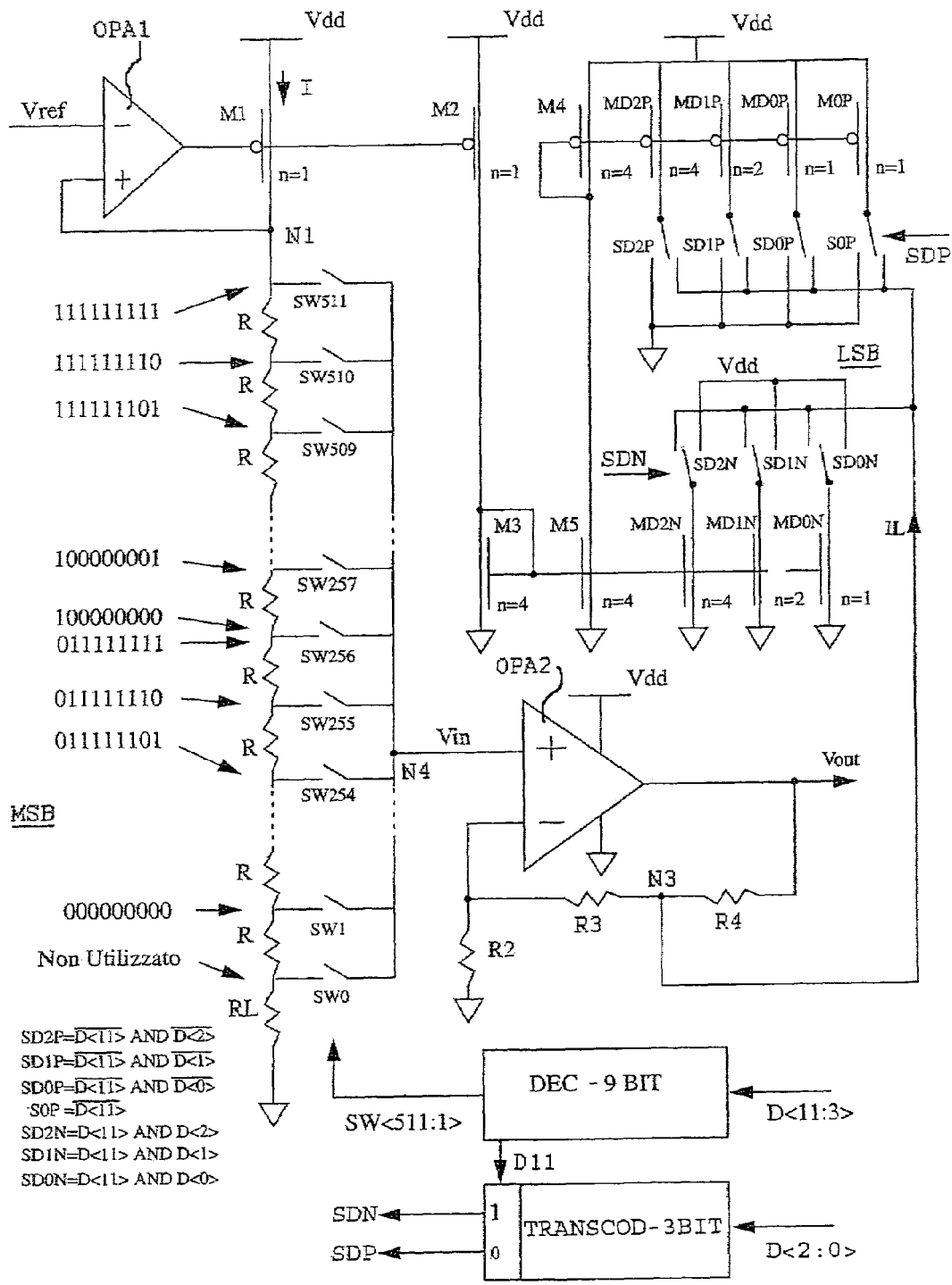

FIG. 4, where components equal to those of FIG. 3 are again indicated by the same symbols, shows a second embodiment of the invention that likewise solves the problem of the poor precision in the case of extensive excursions of the output voltage. The LSB section has been modified as compared with FIG. 3: more particularly, two groups of generators are now used in place of the single group of generators made up of N-channel transistors: one of these still consists of three N-channel transistors, indicated by MD0N, MD1N and MD2N, while the other consists of four P-channel transistors, respectively indicated by MD0P, MD1P, MD2P and M0P. The three transistors MD0P–MD2P have the function of generators presented in binary form and the transistor M0P has the function of a complementary generator, as will be made clear by the explanation about to be given, and has the same weight as the generator of least weight among the three generators presented in binary form. The two groups of generators can be activated alternatively. The current I passing through the MSB section is mirrored both in the branch constituted by the transistors M2 and M3, as in FIGS. 2 and 3, and also in a supplementary branch consisting of one N-channel transistor M5. The transistor M5 has the same size as the transistor M3 (n=4), has its gate electrode in common with the gate electrode of M3 and is connected between Vdd and ground in series with a diode-connected P-channel transistor (M4), once again of the same size as the transistor M3 (n=4). The gate electrode of the transistor M4 is connected to the gate terminals of the four P-channel transistors MD2P, MD1P MD0P and M0P, which can be selectively connected, by means of four electronic selectors SD2P, SD1P, SD0P and S0P controlled by a 3-bit transcoding logic (TRANSCOD-3BIT'), between the supply source terminals (Vdd and ground) or between the node N3 of the feedback resistance of the operational amplifier OPA2 and the terminal Vdd. The sizes of the transistors MD2P, MD1P, MD0P and M0P are such that their currents contribute to the formation of the output voltage Vout of the converter in the right proportion for representing the three less significant bits of the code to be converted. In the example here considered MD2P is of the same size as M4, MD1P is ½ the size of M4, and MD0P and M0P are both ¼ of the size of M4.

The shown MSB section is identical to that of the converter of FIG. 2, but in practice it differs therefrom by virtue of the fact that the electronic switch SW0 always remains open (and can therefore be omitted), that the resistor R connected to the resistor RL can form a single resistor with this latter and that the central switch SW256 is closed by two successive codes 100000000 and 011111111. The reason for these variants will become clear from the explanation of how the converter functions.

The three less significant figures of the digital code to be converted are transcoded by the three-bit transcoder (TRANSCOD-3BIT'), the output of which controls the opening and closing of the electronic selectors of the group of N-channel transistors and the group of P-channel transistors. The activation of one or the other of these groups of transistors is determined by the value of the digital code to be converted and, more precisely, in this particular example, by the value of the most significant figure D11 of the digital code: when D11=1, the group of N-channel transistors is activated, while the group of P-channel transistors is activated when D11=0. In this way, when the output voltage is comprised between Vdd/2 and Vdd, i.e., when it is determined by a digital code in which D11=1, use is made of the generators with N-channel transistors, but when the output voltage is comprised between ground potential and Vdd/2, i.e., when it is determined by a digital code in which D11=0, use is made of the generators with P-channel transistors. Consequently, the two groups of generators always work in a voltage field in which it is certain that the relative transistors are in saturation.

It should be noted that the criterion for the selection of one or the other of the two groups can be different from the one described (based on the value of the most significant bit): in fact, one could take as selector a code other than the central one, always provided that it is comprised in the field of variability of the code to be converted.

The manner in which the converter shown in FIG. 4 works will now be described in some detail.

The resistive divider of the MSB section is in practice made up of 510 ($=2^9-2$) resistors R of equal resistance and a "closure" resistor RL+R. The minimum value of the output voltage of the section, i.e., the input voltage Vin of the operational amplifier OPA2, is given by the voltage drop across RL+R. The 511=$2^9$–1 contacts of the divider (neglecting the "lowest" one, i.e., the connection node to the resistor RL) can be individually connected to the non-inverting input terminal of the operational amplifier OPA2 by means of 511=$2^9$–1 respective electronic switches SW1–SW511. The control signals for the closing and opening of the electronic switches are generated by a 9-bit decoding logic (DEC-9BIT') as functions of the nine most significant bits D<11:3> of the 12-bit input code D<11:0>. More particularly, when D11=1, the logic DEC-9BIT' behaves as in the converters in accordance with FIGS. 2 and 3, i.e., it controls the selective closure of the electronic switches SW256–SW511 in accordance with the digital input code, but when D11=0, it controls the selective closure of the electronic switches SW1–SW256, i.e., the switches from time to time adjacent to (with a higher order number) to the electronic switches that would be closed by the logic of the converters in accordance with FIGS. 2 and 3: for this reason, the central switch SW256 is activated by two different codes (011111111 and 100000000).

The control signals for operating the electronic switches SD0N, SD1N, SD2N associated with the N-channel transistors of the LSB section and the electronic switches SD0P, SD1P, SD2P associated with the P-channel transistors of the LSB section are generated by the 3-bit transcoding logic (TRANSCOD-3BIT') and applied to either one or the other of the two groups of transistors according to the value of the most significant bit (D11) of the code to be converted. The selector S0P associated with the complementary transistor M0P of the group of P-channel transistors is permanently activated when D11=0.

Due to the effect of the sizing of the current-mirror-connected transistors, the currents passing through the branch containing M2 and M3, the branch containing M4 and M5 and the branch containing M1 are equal. Since M3 consists of four modules (n=4), MD0N consists of a single module, MD1N consists of two modules and MD2N consists of four modules, the currents passing in the transistors MD0N, MD1N, MD2N amount to, respectively, ¼*I, ½*I and I. Therefore, when D11=1 and the selectors SD0N, SD1N and SD2N are in the position in which their respective generators are connected to the node N3 (corresponding to the value 1 of the respective control bit), the current IL flowing to the node N3 is a function of the code D<2:0> and, becoming summed with the voltage due to the MSB section, contributes to forming the output voltage of the operational amplifier OPA2. When D11=0, none of the N-channel transistors are connected to the node N3, while the P-channel transistors provide the node N3 with a current that is a function of the code D<2:0>. More particularly, when the code is 000, the selectors SD2P, SD1P, SD0P and S0P are in the position in which they are connected to the node N3, so that the current IL will be the sum of the currents passing through MD2P, MD1P, MD0P and M0P, that is to say, IL=⁸⁄₄*I; when the code is 001, the selectors SD2P, SD1P and S0P are in the position in which they are connected to the node N3 and the selector SD0P is in the position in which it is connected to ground, so that the current IL will be the sum of the currents passing through MD2P, MD1P and M0P, that is to say, IL=⁷⁄₄*I, and so on, up to the code 111, when the selectors are all in the position in which they are connected to ground, with the sole exception of S0P, so that the current IL will be equal to the current passing through M0P, that is to say, IL=¼*I.

As becomes clear when one examines the mode of functioning of the feedback operational amplifier OPA2, the effect of the current injected into the node N3, or taken therefrom, is that of exerting an influence on the formation of the output voltage Vout by adding to the contribution of the MSB section the contribution (of a positive sign or of a negative sign) of the LSB section. More particularly, when D11=1, the MSB section will contribute with a voltage 2*Vin, where Vin is the voltage of the node of the divider corresponding to the digital code D<22:3> to be converted, and the LSB section will contribute with a voltage that becomes added to the one due to the MSB section and varies between 0 and ⅞ of the voltage due to a resistor R of the divider. On the other hand, when D11=0, the MSB section will contribute with a voltage 2*Vin, where Vin is the voltage of the divider node "higher" than the corresponding digital code D<11:3> to be converted, and the LSB section will contribute a voltage that becomes subtracted from the voltage due to the MSB section and varies between ⅝ and ⅛ of the voltage due to a resistor of the divider.

In the embodiment described hereinabove the gain of the operational amplifier OPA2 is equal to two. In practice, however, the gain may be chosen differently from two by appropriately modifying the resistance of the resistor R4 and/or the size of the N-channel and P-channel transistors that determine the current IL injected into the node N3. Let us suppose, for example, that we want a gain of 1.5 for the amplifier and leave unaltered the size of the N-channel and P-channel transistors and therefore also the current IL. In that case the resistance of R4 must not be equal to the resistance of a resistive module R of the divider, but will have to amount to 0.75*R, so that the current may develop a voltage equal to 0.75 times the voltage obtained in the example described above. Furthermore, the resistance of R3, rather than amounting to R2″–R, will have to be (R2″/2) –0.75*R, so that the output voltage will be $$Vout=Vin*(1+((R2''/2-0.75*R)+0.75*R)/R2'') + IL*0.75*R,$$

which upon simplification becomes Vout=Vin*1.5+IL*0.75R. One thus obtains that the minimum current IL causes an output variation equal to ⅛ of the output voltage determined by a resistive module R of the divider.

It is clear from what has been said hereinabove that the converter in accordance with the embodiment of the invention shown in FIG. 4 makes it possible to address the needs of the prior art. In particular, it can be integrated into a small area, and has a low consumption and a high precision. Naturally, whenever consumption is not a problem, the converter can be realized by making do without the feedback divider, i.e., using a resistor R3 of zero resistance in accordance with the scheme of FIG. 2.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A digital-to-analog converter to convert into an analog quantity a digital code including a first part of more significant bits and a second part of less significant bits, comprising:

a first section to convert the first part of the digital code into a first voltage, said first voltage being of discrete voltages that are integral multiples of a predetermined first voltage step;

a second section to convert the second part of the digital code into a current;

means for transforming the current of the second section into a second voltage, said second voltage being of discrete voltages that are integral multiples of a second voltage step equal to ½L of the product of the first voltage step multiplied by a predetermined coefficient, where L is the number of the less significant bits of the digital code to be converted;

control means of the first and the second section; and summation means for generating the analog quantity as the sum of the second voltage and the product of the first voltage multiplied by the predetermined coefficient, comprising a summation circuit with resistive feedback means including a voltage divider; and wherein the means for transforming the current into a second voltage comprises a conversion resistor that forms part of the voltage divider.

2. The converter in accordance with claim 1, wherein the summation circuit comprises an operational amplifier having a first input, a second input and an output connected to the converter output;

the predetermined coefficient is the gain of the operational amplifier;

the voltage divider of the resistive feedback means is connected between the output and the first input of the operational amplifier;

the first section comprises a resistive network having 2M taps, where M is the number of the more significant bits of the digital code to be converted, and substantially equal resistances between adjacent taps, and 2M electronic switches each inserted between a respective tap and a common node connected to the second input of the operational amplifier;

the second section comprises a group of L current generators presented in binary form, selection means of the L current generators and means for conveying the current of the selected generators onto a common node connected to the conversion resistor; and the control means comprise means for selectively operating the electronic switches in such a way as to individually connect each of the 2M taps to the second input of the operational amplifier according to the first part of the digital code and means for selectively operating the selection means of the current generators according to the second part of the digital code.

3. The converter in accordance with claim 2, wherein the second section comprises a further group of L current generators presented in binary form and further selection means of the L further current generators and wherein the control means comprise a selection logic that alternatively activates the use of either one or the other group of generators according to whether the digital code to be converted does or does not exceed, respectively, a predetermined value.

4. The converter in accordance with claim 1, wherein the summation circuit comprises an operational amplifier having a first input, a second input and an output connected to the output of the converter;

the predetermined coefficient is the gain of the operational amplifier;

the voltage divider of the resistive feedback means is connected between the output and the first input of the operational amplifier;

the first section comprises a resistive network having 2M−1 taps, where M is the number of the more significant bits of the digital code to be converted, and substantially equal resistances between adjacent taps, and 2M−1 electronic switches, each inserted between a respective tap and a common node connected to the second input of the operational amplifier;

the second section comprises a group of L current generators presented in binary form, selection means of the L current generators, a further group of current generators, of which L are presented in binary form and one complementary generator having the same weight as the generator of smallest weight of the L current generators, further selection means of the further group of current generators and means for conveying onto a common node, connected to the conversion resistor, the current of the selected generators;

the control means comprise means for selectively operating the electronic switches in such a way as to individually connect each of the 2M−1 taps to the second input of the operational amplifier according to the first part of the digital code, means for selectively operating the selection means of the current generators according to the second part of the digital code and a selection logic that alternatively activates the use of one or the other group of generators according to whether the digital code to be converted does or does not exceed, respectively, a predetermined value.

5. The digital-to-analog converter in accordance with claim 4, wherein the electronic switches of the first section form a first and a second group of electronic switches having an electronic switch in common and wherein the selection logic determines the operation of the electronic switches of the first or the second group according to whether the digital code to be converted does or does not exceed, respectively, a predetermined value and determines the permanent selection of the complementary generator of the further group of current generators when the digital code to be converted does not exceed the predetermined value.

6. A converter in accordance with claim 5, wherein the further current generators of the second group comprise P-channel MOS transistors.

7. The converter in accordance with claim 4, wherein the predetermined value is expressed by the digital code having the most significant bit equal to 0 and the remaining bits equal to 1.

8. The converter in accordance with claim 4, wherein the current generators of the second group comprise N-channel MOS transistors.

9. A converter in accordance with claim 3, wherein the further current generators of the second group comprise P-channel MOS transistors.

10. A circuit, comprising:

a more significant bit converter having an analog voltage output indicative of a more significant bit portion of an input digital signal;

a less significant bit converter having an analog current output indicative of less significant bit portion of the input digital signal;

a summation circuit including a first input terminal coupled to the analog voltage output and a second input terminal; and a feedback path coupled between the second input terminal and an output of the summation circuit and connected to the analog current output;

wherein the less significant bit converter comprises:
a first plurality of current generators;
a second plurality of current generators; and
a selection circuit that selectively connects one or more of the first and second plurality of current generators to the analog current output based on a combination of the less significant bit portion and the more significant bit portion of the input digital signal.

11. The circuit of claim 10 wherein the selection circuit alternatively chooses between connection of the first and second plurality of current generators based on the more significant bit portion of the input digital signal and chooses certain ones of the generators for connection based on the less significant bit portion of the input digital signal.

12. The circuit of claim 10 further comprising a current mirror circuit that mirrors, for use by the first and second plurality of current generators, a current which is flowing in the more significant bit converter.

13. A circuit, comprising:
a more significant bit converter having an analog voltage output indicative of a more significant bit portion of an input digital signal;
a less significant bit converter having an analog current output indicative of less significant bit portion of the input digital signal;
a summation circuit including a first input terminal coupled to the analog voltage output and a second input terminal; and
a feedback path coupled between the second input terminal and an output of the summation circuit and connected to the analog current output;
wherein the less significant bit converter comprises:
a first plurality of current generators;
a second plurality of current generators; and
a selection circuit that selectively connects one or more of the first plurality of current generators to the analog current output, or alternatively selectively connects one or more of the second plurality of current generators to the analog current output, based at least in part on the less significant bit portion of the input digital signal,
wherein the feedback path comprises a first and second resistor connected to each other at a node to form a series voltage divider, the node in the feedback path being connected to the analog current output.

14. The circuit of claim 13 wherein the selection circuit chooses between connection of the first and second plurality of current generators based on the more significant bit portion of the input digital signal.

15. The circuit of claim 13 further comprising a current mirror circuit that mirrors, for use by the first and second plurality of current generators, a current which is flowing in the more significant bit converter.

16. A circuit, comprising:
a more significant bit converter having an analog voltage output indicative of a more significant bit portion of an input digital signal;
a less significant bit converter having an analog current output indicative of less significant bit portion of the input digital signal;
a summation circuit including a first input terminal coupled to the analog voltage output and a second input terminal; and
a feedback path coupled between the second input terminal and an output of the summation circuit and connected to the analog current output;
wherein the less significant bit converter comprises:
a first plurality of current generators;
a first selection circuit operable to selectively connect one or more of the first plurality of current generators to source current to the analog current output based at least in part on the less significant bit portion of the input digital signal;
a second plurality of current generators; and
a second selection circuit operable to selectively connect one or more of the second plurality of current generators to sink current from the analog current output based at least in part on the less significant bit portion of the input digital signal.

17. The circuit of claim 16 wherein the first and second selection circuits choose to make selective connection of the first and second plurality of current generators based additionally on the more significant bit portion of the input digital signal.

18. The circuit of claim 16 further comprising a current mirror circuit that mirrors, for use by the first and second plurality of current generators, a current which is flowing in the more significant bit converter.

19. The circuit of claim 16, wherein the feedback path comprises a first and second resistor connected to each other at a node to form a series voltage divider, the node in the feedback path being connected to the analog current output.

* * * * *

UNITED STATES PATENT AND TRADEMARK OFFICE
CERTIFICATE OF CORRECTION

PATENT NO. : 7,098,831 B2
APPLICATION NO. : 10/791663
DATED : August 29, 2006
INVENTOR(S) : Pierangelo Confalonieri et al.

It is certified that error appears in the above-identified patent and that said Letters Patent is hereby corrected as shown below:

Face of Patent,  Replace "HIGH RESOLUTION AND
Title of the Invention  LOW CONSUMPTION DIGITAL-
ANALOG CONVERTER"
With -- HIGH RESOLUTION AND
LOW CONSUMPTION DIGITAL-TO-
ANALOG CONVERTER --

Signed and Sealed this

Second Day of January, 2007

JON W. DUDAS
*Director of the United States Patent and Trademark Office*